United States Patent [19]

Shirasaka

[11] Patent Number: 5,020,142

[45] Date of Patent: May 28, 1991

[54] AUTOMATIC SCANNING TUNER

[75] Inventor: Shinichi Shirasaka, Tokyo, Japan

[73] Assignee: Pioneer Electronic Corporation, Tokyo, Japan

[21] Appl. No.: 338,076

[22] Filed: Apr. 14, 1989

[30] Foreign Application Priority Data

Oct. 18, 1988 [JP] Japan .................................. 63-260597

[51] Int. Cl.⁵ .............................................. H03J 7/18
[52] U.S. Cl. ..................................... 455/166; 455/165; 455/186
[58] Field of Search ............... 455/158, 166, 179, 185, 455/186, 183, 151, 181, 161, 164, 165; 358/191.1

[56] References Cited

U.S. PATENT DOCUMENTS

| 4,461,036 | 7/1984 | Williamson et al. | 455/166 |
| 4,510,623 | 4/1985 | Bonneau et al. | 358/191.1 |
| 4,603,438 | 7/1986 | Fillman | 455/166 |

Primary Examiner—Curtis Kuntz
Attorney, Agent, or Firm—Sughrue, Mion, Zinn, Macpeak & Seas

[57] ABSTRACT

In an automatic scanning tuner which stops at tuned stations in scanning up and down a range of frequencies, apparatus is provided for ignoring stations at which a user does not wish the tuner to stop as it moves up or down the dial. Information regarding the stations to be ignored may be stored in advance in a memory, such as a RAM.

9 Claims, 2 Drawing Sheets

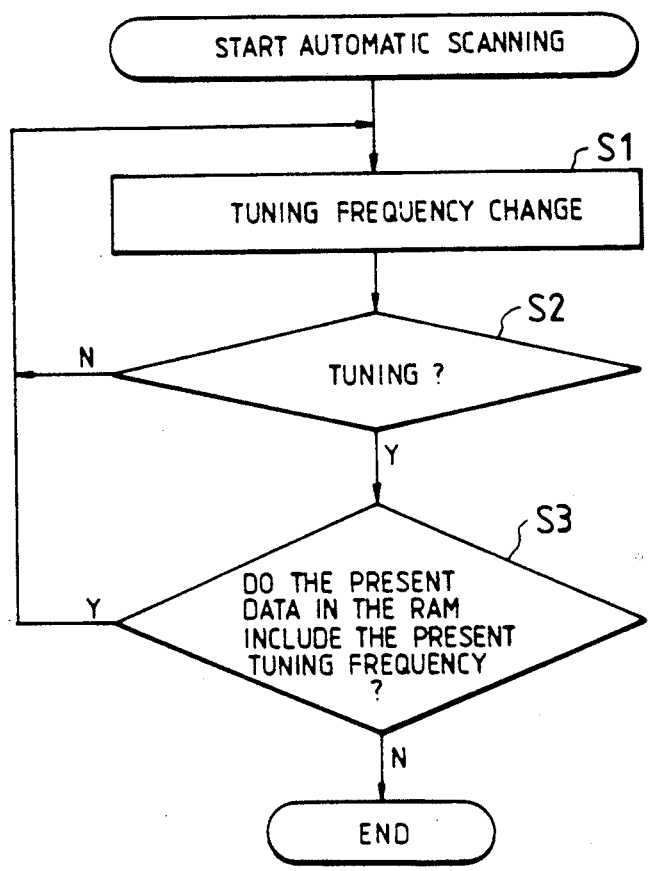

AUTOMATIC SCANNING TUNER

BACKGROUND OF THE INVENTION

The present invention relates to an automatic scanning tuner for automatically scanning a tuning frequency to search for a desired station.

Conventional tuners have had a receiving frequency incremented or decremented in accordance with an automatic scanning operation, the scanning operation being stopped immediately upon detection of a station to be received so that the searched station can be received thereafter. This automatic scanning function is a very effective method of channel selection and therefore is provided in many tuners.

Generally, such a tuner is provided with a preset function in which frequency information of predetermined stations is preset, that is stored in advance, and this information is selectively or automatically sequentially called out by the operation of a special key so that a desired station is channel-selected in accordance with the called-out information.

As described above, channel selection of a preset station is performed by use of preset information. However, when a user considers using the automatic scanning function, there are a few cases where the user wants to channel-select a station which has been preset, but in many cases, the user rather feels it troublesome when scanning stops at every preset station. Particularly, the troublesome feeling may be increased in countries like the United States which have so many stations that scanning will be stopped very often if an automatic scanning mode is selected.

SUMMARY OF THE INVENTION

It is an object of the present invention to remedy the foregoing deficiencies in the prior art.

It is another object of the present invention to provide an automatic scanning tuner in which scanning is not stopped at a preset station when in an automatic scanning mode, so as to reduce a user's unease, and accordingly improve ease of use.

In order to attain the foregoing objects of the present invention, the automatic scanning tuner comprises: automatic scanning start operation means for instructing a start of automatic scanning; tuning frequency data generation means for shifting tuning frequency data in accordance with operation of the automatic scanning start operation means to change a tuning frequency; tuning detection means for detecting whether tuning to the tuning frequency has been carried out, the detection being based on the tuning frequency data from the tuning frequency data generation means; storage means for storing, in advance, preset data regarding a tuning frequency; and judgment means for judging whether preset data corresponding to the tuning frequency data generated by the tuning frequency data generation means are stored in the storage means, wherein when the tuning detection means detects a tuned state, the changing operation of the tuning frequency by the tuning frequency data generation means is not stopped when the judgment means judges that preset data corresponding to the tuning frequency data are stored in the storage means.

BRIEF DESCRIPTION OF THE DRAWINGS

Other features and advantages of the present invention will be apparent from the following description taken in connection with the accompanying drawings, wherein:

FIG. 3 is a flow chart illustrating a performance of a CPU in FIG. 2.

DETAILED DESCRIPTION OF THE PREFERRED EMBODIMENT

Figure 1:
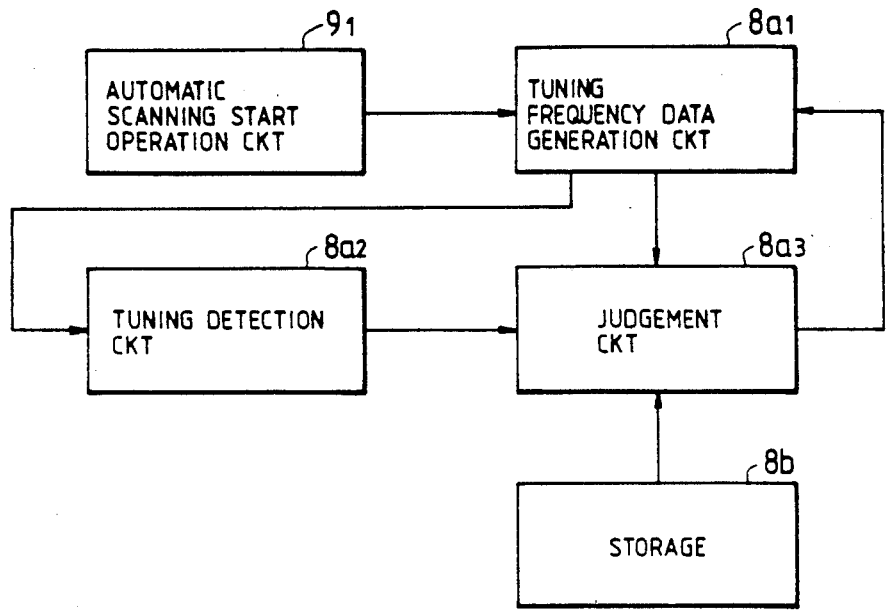
FIG. 1 is a block diagram illustrating a basic arrangement of a control circuit in an automatic scanning tuner according to the present invention.

First, for better understanding of the present invention, the basic construction of the present invention will be described with reference to FIG. 1. As shown in FIG. 1, the automatic scanning tuner according to the present invention includes an automatic scanning start operation circuit $9_1$ for instructing start of automatic scanning. A tuning frequency data generation circuit $8a_1$ shifts tuning frequency data in accordance with an operation of the automatic scanning start operation circuit $9_1$ to change a tuning frequency. A tuning detection circuit $8a_2$ detects whether tuning has been made to the tuning frequency, the determination being based on the tuning frequency data received from the tuning frequency data generation circuit $8a_1$.

A storage device $8b$, which may be a RAM, stores preset data about a tuning frequency in advance. A judgment circuit $8a_3$ judges whether preset data corresponding to the tuning frequency data generated by the tuning frequency data generation circuit $8a_1$ are stored in the storage device $8b$. In the operation of the device, when the tuning detection circuit $8a_2$ detects a tuned state, the changing operation of the tuning frequency by the tuning frequency data generation circuit $8a_1$ is not stopped when the judgment circuit $8a_3$ judges that preset data corresponding to the tuning frequency data are stored in the storage device $8b$.

In this configuration, when the automatic scanning start operation circuit $9_1$ is operated so as to initiate automatic scanning, the tuning frequency data generation circuit $8a_1$ shifts tuning frequency data to change the tuning frequency. The tuning detection circuit $8a_2$ detects whether tuning has been made to the tuning frequency on the basis of the tuning frequency data from the tuning frequency data generation circuit $8a_1$. If a tuned state is detected, the judgment circuit $8a_3$ judges whether data corresponding to the tuning frequency at the time upon detection of the above-mentioned tuned state are included in the preset data stored in advance in the storage device $8b$. If the output of the judgment circuit $8a_3$ indicates that the data does not so correspond, the changing operation of the tuning frequency data being executed by the tuning frequency data generation circuit $8a_1$ stops so as to terminate the automatic scanning operation.

Consequently, in an automatic scanning mode, it is possible to scan not-preset stations effectively without stopping the scanning operation at stations which have been preset.

Next, a preferred embodiment of the present invention will be described with reference to the drawings.

Figure 2:
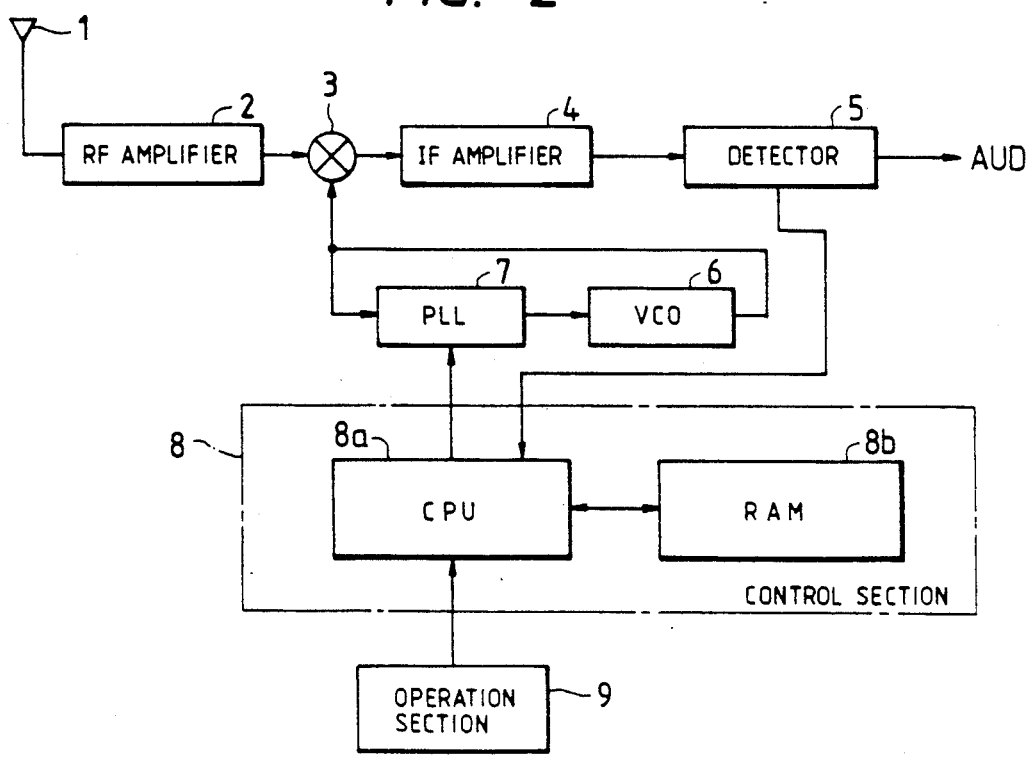
FIG. 2 is a block diagram illustrating an embodiment of the automatic scanning tuner according to the present invention.

FIG. 2 is a block diagram illustrating an embodiment of the automatic scanning tuner according to the present invention. In FIG. 2, the circuit construction includes an antenna 1, an RF amplifier 2, a mixer 3, an IF amplifier 4, and a detector 5. The circuit also includes a VCO 6, which in turn includes a local oscillator. The circuit further includes a PLL circuit 7 for locking an oscillation frequency, a control section 8, and an operation section 9.

The PLL circuit 7 includes a programmable frequency divider, a phase comparator, a reference oscillator, a low pass filter, (all not shown) and so on. The control section 8 includes a CPU 8a (which may be a microprocessor) which operates on the basis of a predetermined program, and a RAM 8b for storing preset data. The control section 8 is arranged so as to set frequency division ratio, as frequency information, for the programmable frequency divider of the PLL circuit 7. The operation section 9 includes an automatic scanning (up/down) start key, a preset scanning start key, a preset channel-selection key, a preset memory key, and so on.

In the above-mentioned configuration, if the control section 8 supplies frequency dividing ratio data to the programmable frequency divider of the PLL circuit 7, the VCO 6 oscillates at a frequency corresponding to the data of frequency dividing ratio, and applies the oscillation output thereof to one of the inputs of the mixer 3. A reception signal received through the antenna 1 is applied, after being amplified in the RF amplifier 2, to the other input of the mixer 3, and a signal corresponding to a difference or sum of the two input signals is produced at the output of the mixer 3. The output signal of the mixer 3 is intermediate-frequency amplified in the IF amplifier 4, and then is applied to the detector 5 so that an audio signal is obtained at the output of the detector 5. The detector 5 produces a tuning meter signal by use of its S-shaped characteristic and supplies the tuning meter signal to the CPU 8a of the control section 8. Since the tuning meter signal has a level which becomes L (low) in a tuned state, the CPU 8a can detect a tuned state on the basis of the tuning meter signal.

Upon operation of the automatic scanning (up/down) start key of the operation section 9, the CPU 8a responds to sequentially increase/decrease the frequency dividing ratio data which is being outputted. In response to the change of the frequency dividing ratio data, the oscillation frequency of the VCO 6 is decreased/increased to perform automatic scanning. If a tuned station is located during this automatic scanning, the level of the tuning meter signal from the detector 5 becomes L, and the CPU 8a stops the increase/decrease of the frequency dividing ratio data to stop the automatic scanning, so that the tuned station can be revived. If the tuned station is not a desired one, the above-mentioned operation is resumed by operating the automatic scanning key again. It is possible that scanning is stopped in a predetermined period if there is a tuned station, and automatic scanning is resumed automatically if a stop operation is not carried out within the predetermined period.

Upon detection of a tuned station on the basis of the tuning meter signal from the detector 5 as described above, the CPU 8a compares the frequency dividing ratio data which is being produced therefrom at that time with the preset data stored in the RAM 8b to judge whether any data corresponding to the frequency dividing ratio data is stored in the RAM 8b. If the corresponding data is not stored in the RAM 8b, the CPU 8a stops the automatic scanning operation as has been described above, but if the corresponding data is stored, the CPU 8a continues the automatic scanning operation without stopping it.

FIG. 3 is a flow chart illustrating a task to be executed by the CPU 8a on the basis of a predetermined program upon operation of the automatic scanning key. In FIG. 3, if the automatic scanning key is operated, in the first step S1, the CPU 8a changes the frequency dividing ratio data to be supplied to the programmable frequency divider of the PLL circuit 7, in order to increase/decrease the tuning frequency. Thereafter, the CPU 8a judges, on the basis of the level of the tuning meter signal from the detector 5, whether the tuning frequency change in the step S1 is tuned to a tuned state. When the level of the tuning meter signal is H (high) and the answer is "NO" (that is, no tuned state is located), the CPU 8a returns to the step S1 and changes the tuning frequency again. However, if the level of the tuning meter signal is L and the answer of the judgment is "YES", that is, a tuned state is located, the CPU 8a advances to the step S3 in which the CPU 8a compares the frequency dividing ratio data corresponding to the tuning frequency changed in the above-mentioned step S1 with the data stored in advance in the RAM 8b for the sake of preset channel-selection, to judge whether data corresponding to the preset tuning frequency is included in the preset data in the RAM 8b.

If the answer of the judgment in the step S3 in "NO", that is, preset data corresponding to the preset tuning frequency are not stored in the RAM 8b, the CPU 8a stops the above-mentioned operation caused by the operation of the automatic scanning key, so that the reception is performed at the tuning frequency changed and set in the step S1. However, if the answer of the judgment in the step S3 in "YES", that is, preset data corresponding to the preset tuning frequency are stored in the RAM 8b, the CPU 8a returns to the step S1 in which the CPU 8a changes the tuning frequency again. By the above-mentioned operation in the step S3, even if a tuned state is caused, the automatic scanning operation is continued without stopping when the tuned station is a preset one. Thus, the invention enables a user to preset stations which are to be ignored during a scanning operation.

According to the present invention, as described above, the scanning operation is not stopped at a preset station in an automatic scanning mode, but stations which are not preset are scanned efficiently. Accordingly, it is possible to reduce the troublesome feeling of a user and thus improve ease of use.

Various changes within the spirit of the invention will be apparent to those of working skill in this technology. Accordingly, the invention is to be constructed as limited by the appended claims.

What is claimed is:

1. An automatic scanning tuner comprising:
   automatic scanning start operation means for initiating automatic scanning;
   tuning frequency data generation means for shifting tuning frequency data in accordance with an operation of said automatic scanning start operation means to change a tuning frequency of said tuner;
   tuning detection means for detecting whether tuning has been performed to said tuning frequency, based on said tuning frequency data from said tuning frequency data generation means;
   storage means for indefinitely storing preset tuning frequencies in advance;

comparison means for comparing data corresponding to said tuning frequency data with said preset tuning frequencies each time said automatic scanning operation means is initiated; and judgment means responsive to said comparison means for judging whether said data corresponding to said tuning frequency data is stored in said storage means;

wherein, when said tuning detection means detects a tuned state, the changing operation of the tuning frequency by said tuning frequency data generating means is continued when said judgment means judges that said data corresponding to said tuning frequency data is stored in said storage means.

2. An automatic scanning tuner as claimed in claim 1, wherein said storage means comprises a RAM.

3. An automatic scanning tuner as claimed in claim 1, wherein said tuning frequency data generation means, said tuning detection means, said comparison means, and said judgment means comprise a microprocessor.

4. An automatic scanning tuner as claimed in claim 1, wherein the changing operation of the tuning frequency by said tuning frequency data generation means is stopped when said judgment means judges that said data corresponding to said tuning frequency data is not stored in said storage means, said changing operation being resumed within a predetermined period.

5. An automatic scanning tuner comprising:
automatic scanning start operation means for initiating automatic scanning;
tuning frequency data generation means for shifting tuning frequency data in accordance with an operation of said automatic scanning start operation means to change a tuning frequency of said tuner;
tuning detection means for detecting whether tuning has been performed to said tuning frequency, based on said tuning frequency data from said tuning frequency data generation means; and
means for ignoring preselected stations during said automatic scanning, said means for ignoring preselected stations comprising comparison means for comparing data corresponding to said tuning frequency data with preset tuning frequencies each time said automatic scanning operation means is initiated.

6. An automatic scanning tuner as claimed in claim 5, wherein said means for ignoring further comprises:
storage means for indefinitely storing said preset tuning frequencies in advance; and
judgment means responsive to said comparison means for judging whether said data corresponding to said tuning frequency data is stored in said storage means;
wherein, when said tuning detection means detects a tuned state, the changing operation of the tuning frequency by said tuning frequency data generation means is continued when said judgment means judges that said data corresponding to said tuning frequency data is stored in said storage means.

7. An automatic scanning tuner as claimed in claim 6, wherein said storage means comprises a RAM.

8. An automatic scanning tuner as claimed in claim 6, wherein said tuning frequency data generation means, said tuning detection means, said comparison means, and said judgment means comprise a microprocessor.

9. An automatic scanning tuner as claimed in claim 6, wherein the changing operation of the tuning frequency by said tuning frequency data generation means is stopped when said judgment means judges that said data corresponding to said tuning frequency data is not stored in said storage means, said changing operation being resumed within a predetermined period.

* * * * *